(12) United States Patent
Kim et al.

(10) Patent No.: US 8,557,701 B2
(45) Date of Patent: Oct. 15, 2013

(54) METHOD FOR FABRICATING A SEMICONDUCTOR DEVICE WITH FORMATION OF CONDUCTIVE LINES

(75) Inventors: Mi-Hye Kim, Gyeonggi-do (KR); Byung-Sub Nam, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/295,450

(22) Filed: Nov. 14, 2011

(65) Prior Publication Data

US 2013/0056878 A1 Mar. 7, 2013

(30) Foreign Application Priority Data

Sep. 5, 2011 (KR) .......................... 10-2011-0089543

(51) Int. Cl.
*H01L 23/48* (2006.01)
*H01L 21/44* (2006.01)
*H01L 21/4763* (2006.01)

(52) U.S. Cl.
USPC .................. 438/672; 257/774; 257/E21.585; 438/637; 438/675

(58) Field of Classification Search
USPC ........... 257/774, E21.585; 438/672, 637, 675
See application file for complete search history.

(56) References Cited

U.S. PATENT DOCUMENTS

| | | | |
|---|---|---|---|
| 2002/0048944 A1* | 4/2002 | Tang et al. | 438/672 |
| 2002/0102843 A1* | 8/2002 | Seta et al. | 438/672 |
| 2002/0168849 A1* | 11/2002 | Lee et al. | 438/637 |
| 2005/0009326 A1* | 1/2005 | Manning | 438/637 |
| 2006/0073699 A1* | 4/2006 | Lee et al. | 438/639 |
| 2006/0194432 A1* | 8/2006 | Park et al. | 438/672 |
| 2006/0264042 A1* | 11/2006 | Matz et al. | 438/672 |
| 2006/0276034 A1* | 12/2006 | Blanchard | 438/672 |
| 2007/0148964 A1* | 6/2007 | Lee et al. | 438/637 |
| 2008/0142989 A1* | 6/2008 | Hayashi et al. | 257/774 |
| 2009/0289326 A1* | 11/2009 | Park et al. | 257/532 |
| 2010/0029076 A1* | 2/2010 | Daamen et al. | 438/637 |

* cited by examiner

*Primary Examiner* — Jae Lee
*Assistant Examiner* — David Hoang
(74) *Attorney, Agent, or Firm* — IP & T Group LLP

(57) ABSTRACT

A substrate having a first region and second regions disposed on two sides of the first region; a first group of conductive lines extending from the first region to the second regions on the substrate; a second group of conductive lines alternating with the first group of times and extending from the first region to the second regions on the substrate; interlayer insulating layers formed over the substrate; insulating layers formed in first open regions of the interlayer insulating layers and the first group of conductive lines in the second region; and contact plugs contacting second group of conductive line formed in second open regions of the interlayer insulating layer in the second region.

17 Claims, 19 Drawing Sheets

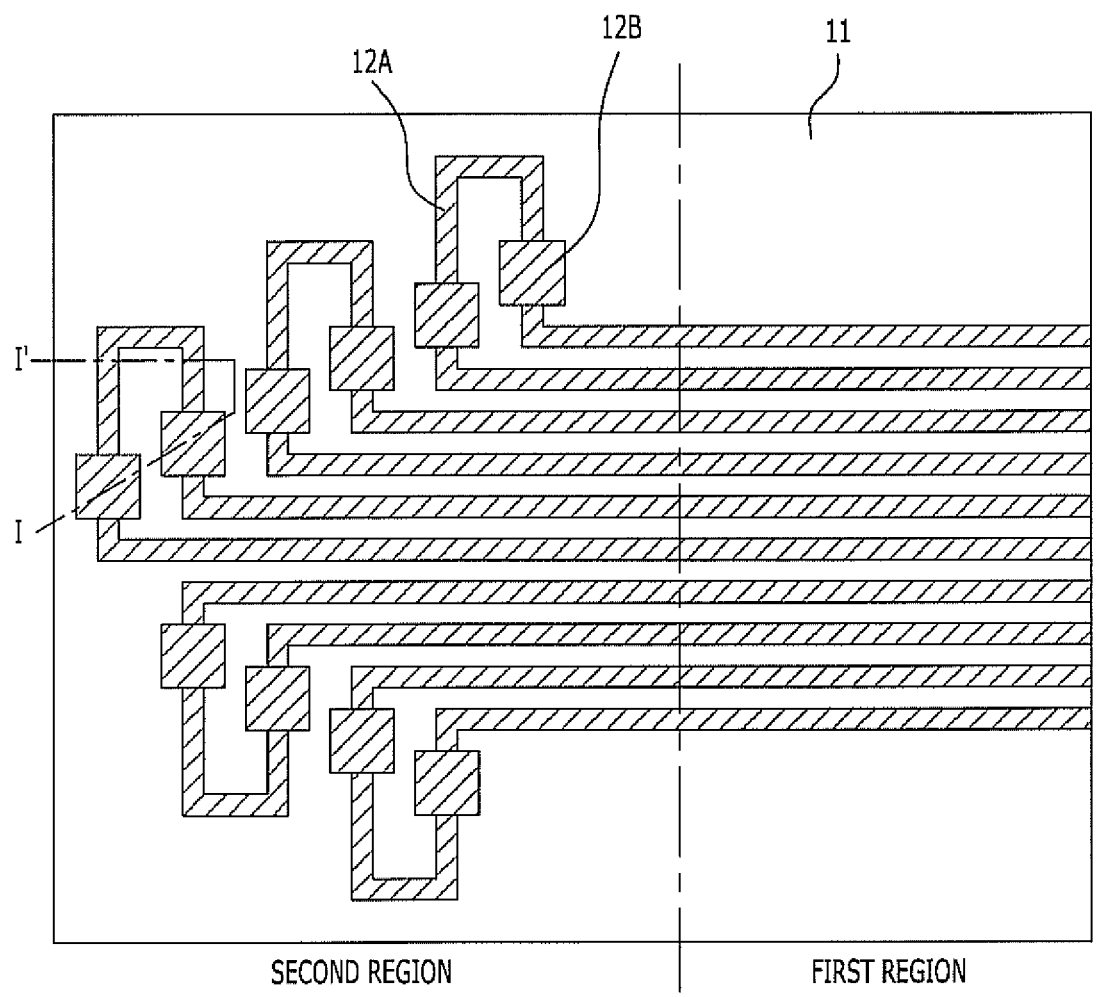

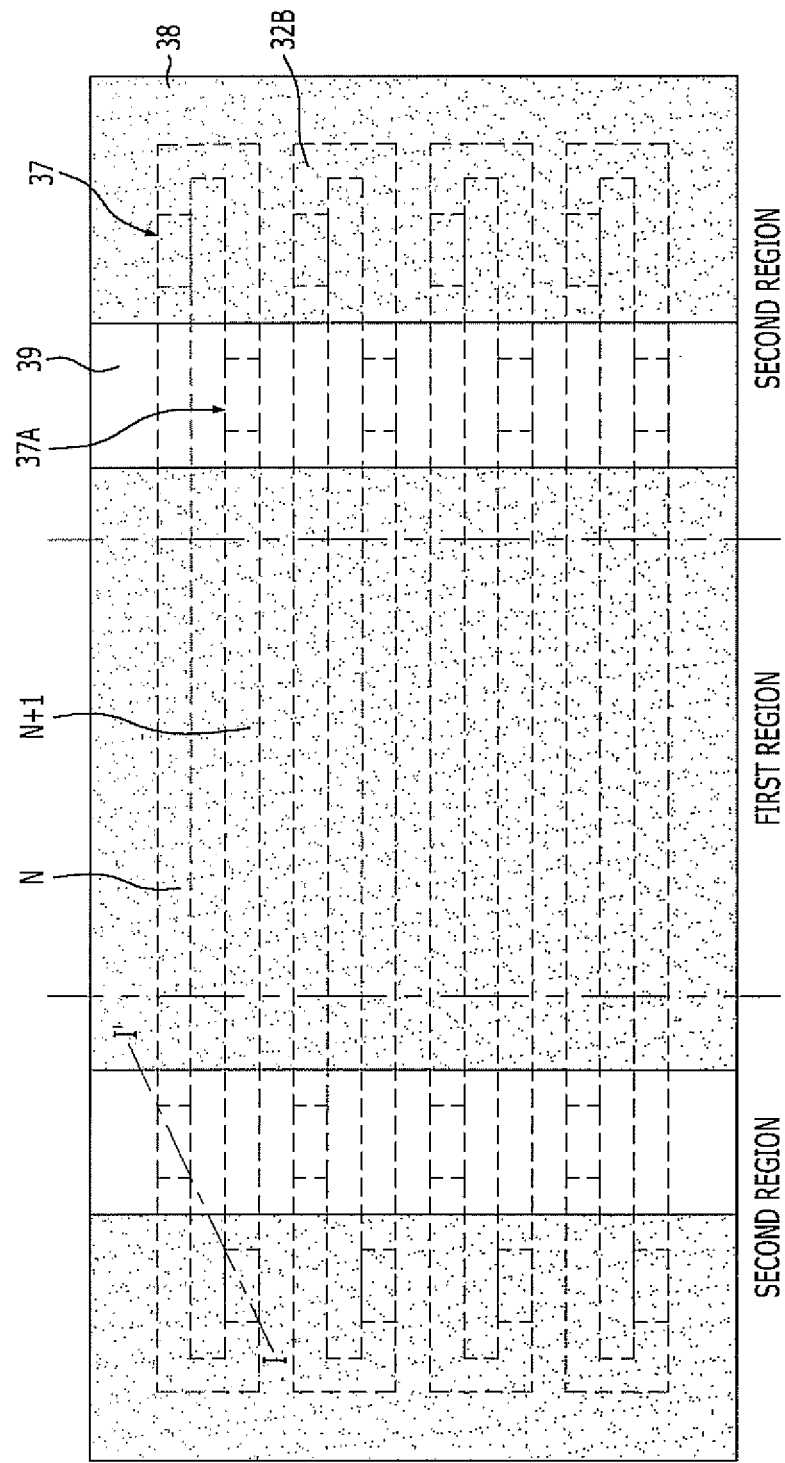

METHOD FOR FABRICATING A SEMICONDUCTOR DEVICE WITH FORMATION OF CONDUCTIVE LINES

CROSS-REFERENCE TO RELATED APPLICATIONS

The present application claims priority of Korean Patent Application No. 10-2011-0089543, filed on Sep. 5, 2011, which is incorporated herein by reference in its entirety.

BACKGROUND

1. Field

Exemplary embodiments of the present invention relate to a technology for fabricating a semiconductor device, and more particularly, to a semiconductor device with a padless structure and a method for fabricating the same.

2. Description of the Related Art

Spacer patterning technology (SPT) may be used to form word lines of a semiconductor memory device. Generally, a semiconductor device has a cell region and a peripheral circuit region. The word lines have a structure where the cell region extends from the peripheral circuit region, and the peripheral circuit region includes a region where pads are formed that electrically connect conductive lines (for example, metal wirings) and the word lines. An example of the region where pads are formed is a decoder region. In this configuration, bridge fail may result because the decoder region always has an insufficient patterning margin due to the structural shape. Further, with the decrease in the design rules, the patterning margin may be even more reduced when a double spacer patterning technology (double-SPT) is applied instead of a single spacer patterning technology (single-SPT). Hereafter, features of a semiconductor device in accordance with the conventional technology will be described in detail with reference to the accompanying drawings.

FIGS. 1A to 1D are plane views illustrating a method for fabricating a semiconductor device in accordance with the conventional technology, and FIGS. 2A to 2D are cross-sectional views taken along the line I-I' illustrated in FIGS. 1A to 1D. Further, FIGS. 3A to 3C are images illustrating features of a semiconductor device in accordance with the conventional technology.

As illustrated in FIGS. 1A and 2A, a conductive layer 12 is formed on a substrate 11 having a first region and a second region. In this example, the first region is the cell region and the second region is the peripheral circuit region including a decoder region where the pads are formed.

Next, a sacrificial pattern 13 is formed on the conductive layer 12, and a first mask pattern 14 is formed on sidewalls of the sacrificial pattern 13. Subsequently, the sacrificial pattern 13 is removed.

As illustrated in FIGS. 1B and 2B, second mask patterns 15 are formed on the conductive layer 12 around first mask patterns 14 by using a PAD mask.

As illustrated in FIGS. 1C and 2C, the conductive layer 12 is etched using the first and second mask patterns 14 and 15 as an etch mask to form pads 12B in the second region while forming conductive lines 12A in the first and second regions. After etching the conductive layer 12, the first and second mask patters 14 and 15 are removed.

As illustrated in FIGS. 1D and 2D, the conductive lines 12A between the pads 12B are etched using a cut mask to separate adjacent conductive lines 12A.

However, in the conventional technology, the first mask pattern 14 formed in the second region is formed with a 90° bend from the extending direction of the first mask pattern 14 to provide a space where the pad 12B is formed. Due to the bent structural characteristics, a pattern is broken at the 90° bend since a margin for a photolithography process is insufficient (see FIG. 3A). Also due to the bent structural characteristics, securing critical dimension uniformity (CDU) (see FIG. 3B) may be difficult, and a bridge is generated between adjacent patterns (see FIG. 3C) as illustrated in FIGS. 3A to 3C.

In addition, the semiconductor device in accordance with the conventional technology, the pads 12B are uniformly disposed at the ends of the conductive lines 12A. In this case, since the semiconductor device requires a larger space corresponding to an interval between the respective pads 12B, it is difficult to reduce an area of the second region due to the pads 12B even though integration of the conductive lines 12A disposed in the first region is increased (more specifically, even though the area of the first region is reduced). More specifically, a chip size of the semiconductor device may be difficult to reduce due to the pads 12B. To reduce the area of the second region, an arrangement of the cut mask and the pad mask is complicated, which acts as a factor of reducing a margin of a conductive line 12A forming process and increasing a difficulty of subsequent processes (for example, a contact plug forming process, a metal wiring forming process) to degrade a yield of the semiconductor device.

SUMMARY

An embodiment of the present invention is directed to a semiconductor device with a padless structure and a method for fabricating the same.

In accordance with an embodiment of the present invention, a method for fabricating a semiconductor device includes: forming a first group of conductive lines extending from a first region to a plurality of second regions over a substrate having the first region and the plurality of second regions; forming an interlayer insulating layer over the substrate; forming a second group of conductive lines that alternate with the first group of lines and extend from the first region to the plurality of second regions over the substrate; forming open regions partially exposing the first and second groups of conductive lines by selectively etching the interlayer insulating layer in the plurality of second region; forming an extended open region by removing a portion of each conductive line in the first group of conductive lines exposed by the open regions; forming an insulating layer burying in extended open region; and forming contact plugs by gap-filling the open regions.

In accordance with yet another embodiment of the present invention, a method for fabricating a semiconductor device includes: forming a first group of conductive lines extending from a first region to second regions on a substrate having the first region and a pair of second regions disposed at both sides of the first region; forming a second group of conductive lines that alternate with the first group of lines and extend from the first region to the second regions over the substrate at both sides of the first region; forming an interlayer insulating layer over the substrate; forming open regions partially exposing the first and second group of conductive lines by selectively etching the interlayer insulating layer of the second region; forming a mask pattern exposing the open regions formed in the first group of conductive lines on the interlayer insulating layer; forming an extended open region by etching the first group of conductive lines in the open regions exposed by the mask pattern; forming an insulating layer burying the extended open region; removing the mask pattern; forming a conductive layer for a plug in the open regions over the substrate; and forming contact plugs in the open regions by performing a planarization process until the interlayer insulating layer is exposed.

In accordance with still another embodiment of the present invention, a semiconductor device includes: a substrate having a first region and second regions disposed on two sides of the first region; a first group of conductive lines extending from the first region to the second regions on the substrate; a second group of conductive lines alternating with the first group of times and extending from the first region to the second regions on the substrate; an interlayer insulating layer formed over the substrate; an insulating layer formed in first open regions of the interlayer insulating layer and an the first group of conductive line in the second region; and contact plugs contacting the second group of conductive line formed in the second open regions of the interlayer insulating layer in the second region.

BRIEF DESCRIPTION OF THE DRAWINGS

FIGS. 1A to 1D are plan views illustrating a method for fabricating a semiconductor device in accordance with the conventional technology.

FIGS. 4A to 4G are plan views illustrating a method for fabricating a semiconductor device in accordance with an embodiment of the present invention.

DETAILED DESCRIPTION

Figure 1A:
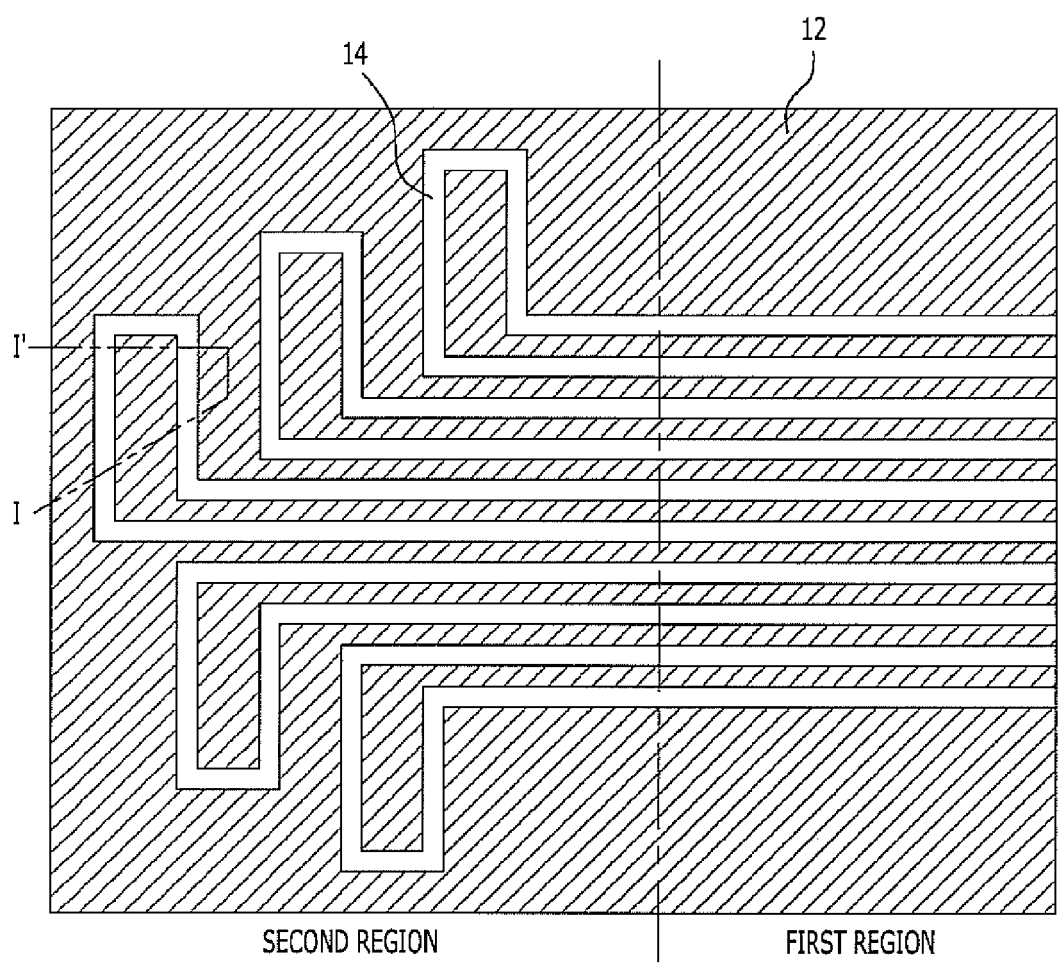
Figure 1B:
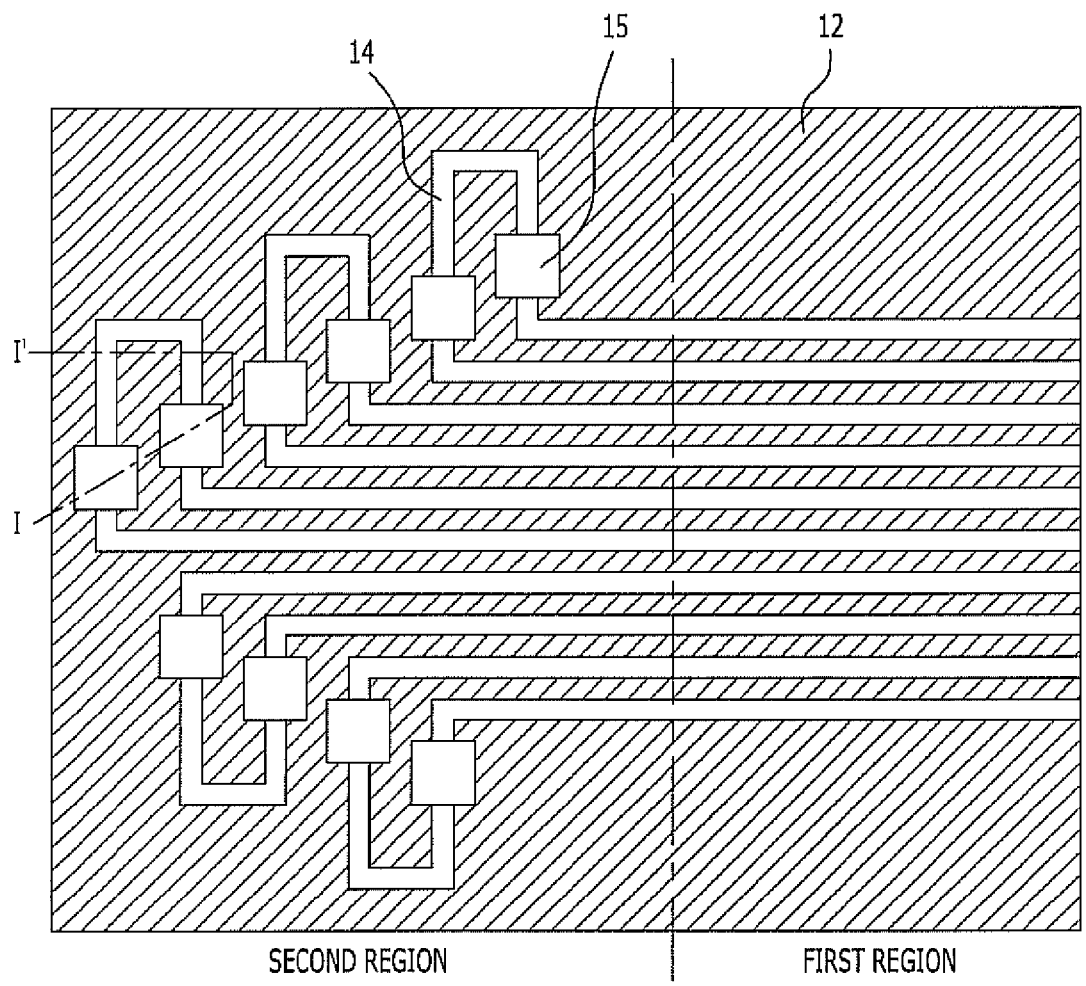
Figure 1D:
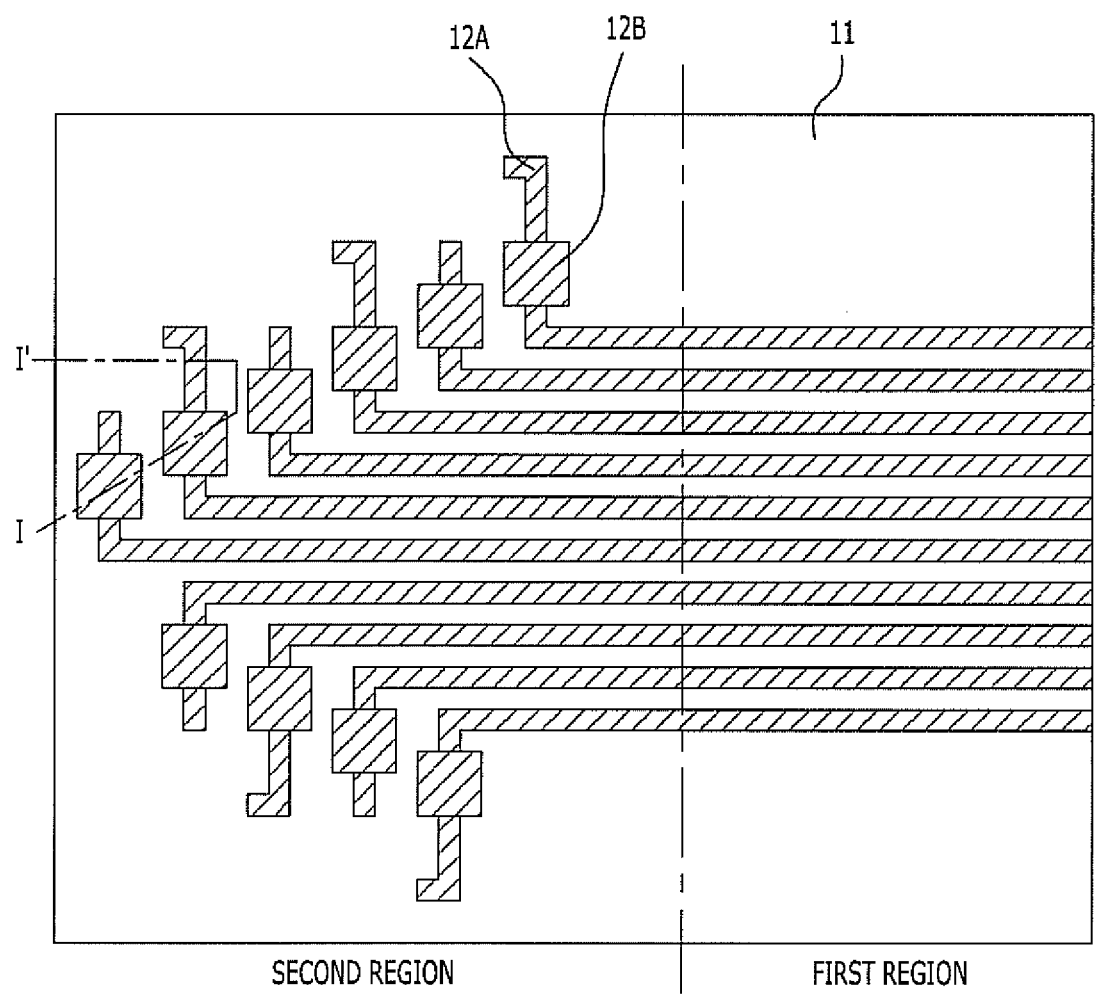
Figure 2A:
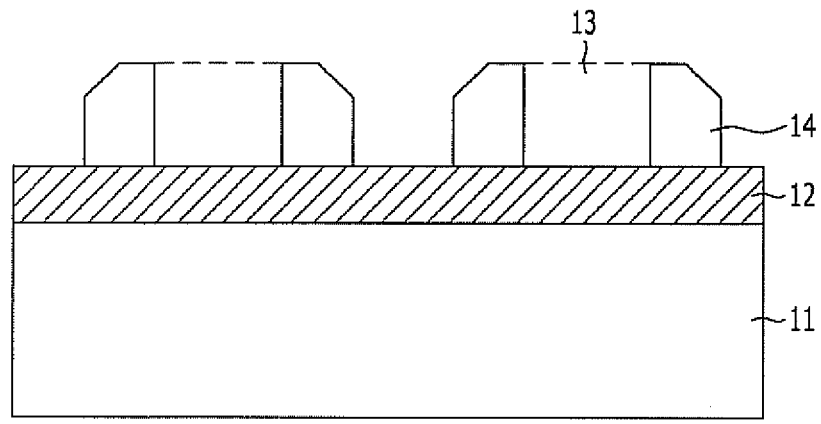
FIGS. 2A to 2D are cross-sectional views taken along the line I-I' illustrated in FIGS. 1A to 1D.
Figure 2B:
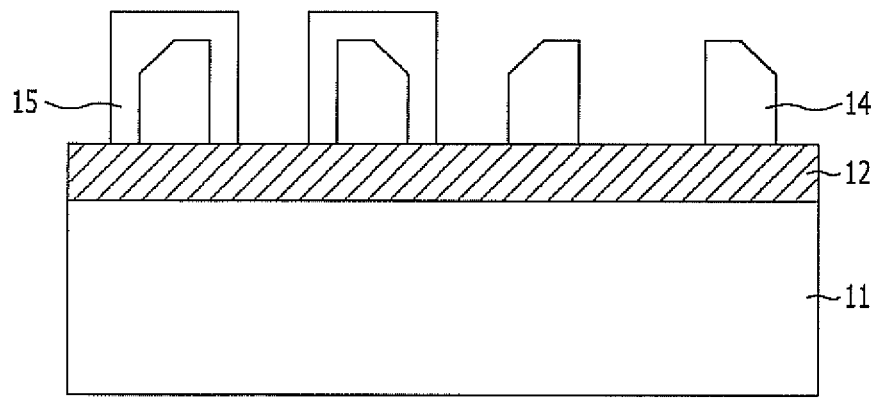
Figure 2C:
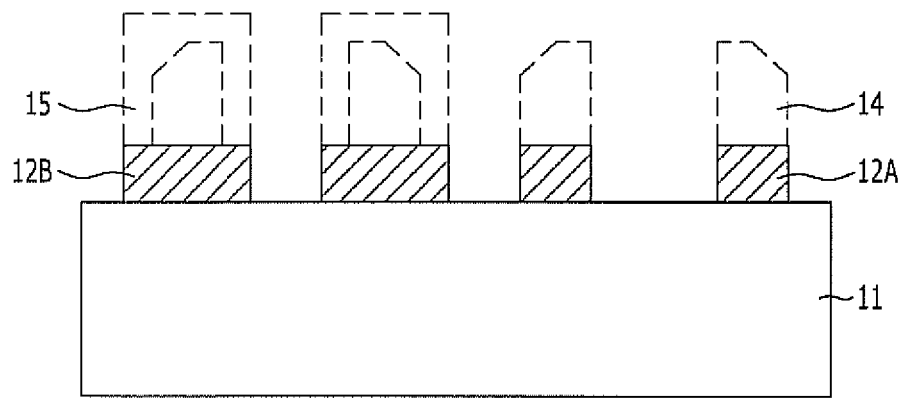
Figure 2D:
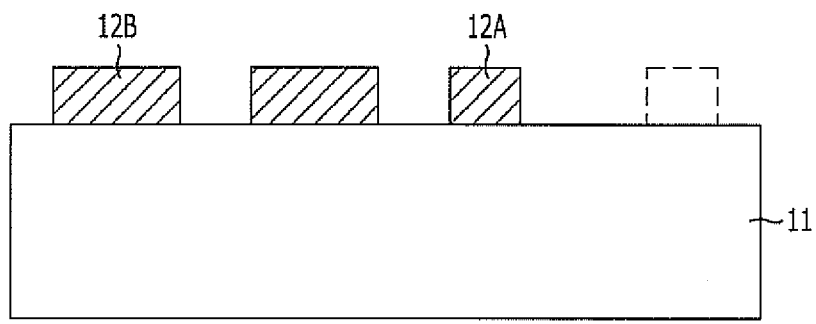
Figure 3A:
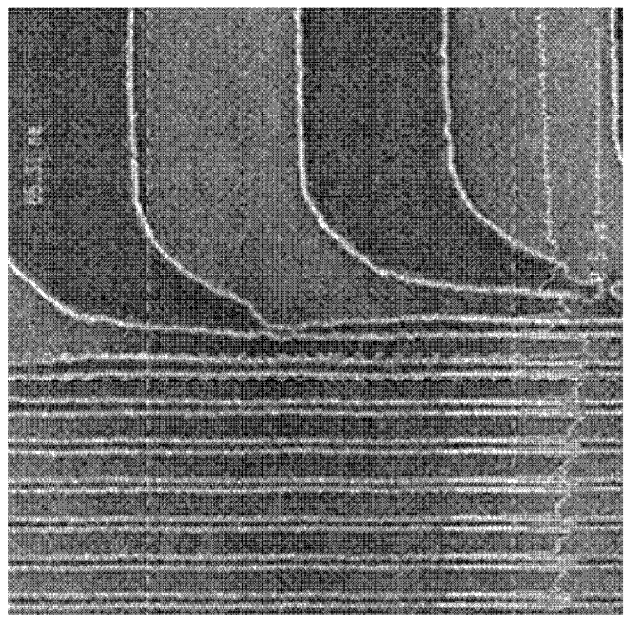
FIGS. 3A to 3C are images illustrating features of a semiconductor device in accordance with the conventional technology.
Figure 3B:
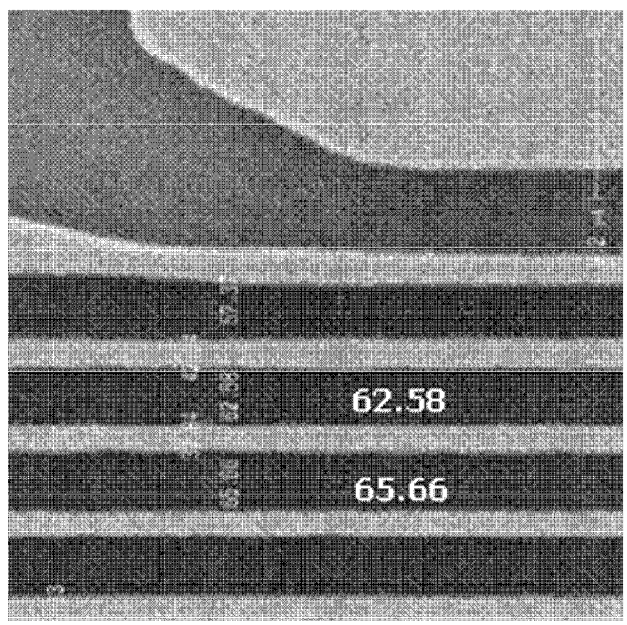
Figure 3C:
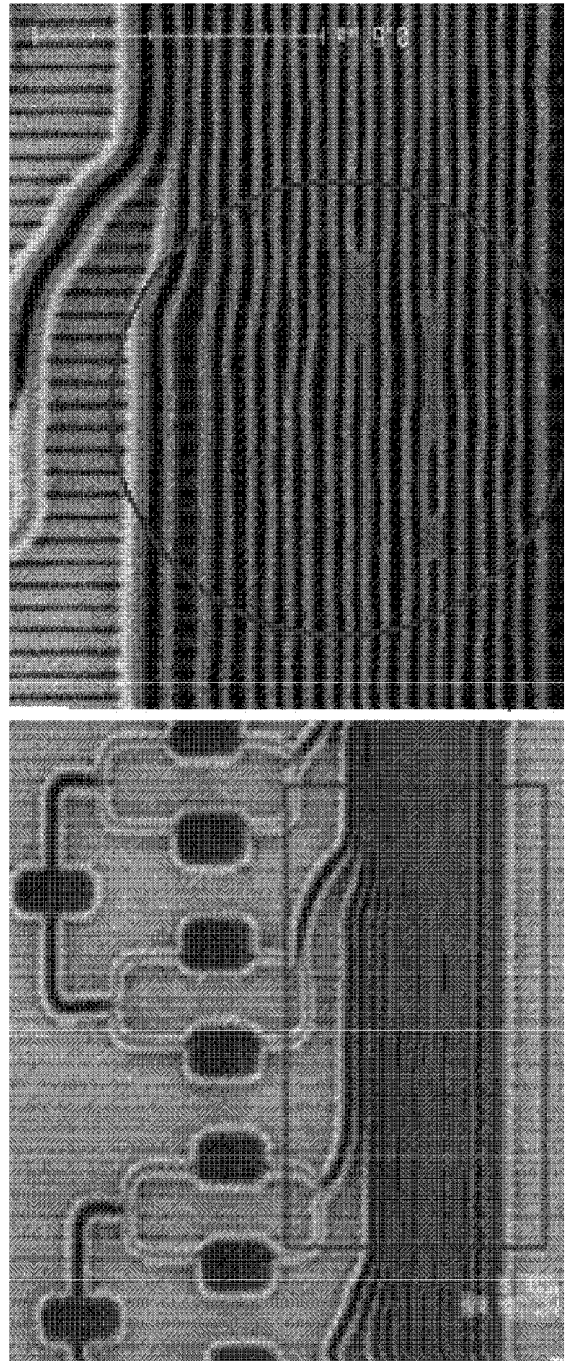

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereafter, exemplary embodiments of the present invention will be described with reference to the accompanying drawings so that a person with an ordinary skilled in the art to which the present invention pertains can easily carry out technical ideas of the present invention. The exemplary embodiments of the present invention to be described later provide a semiconductor device with a padless structure and a method for fabricating the same.

FIGS. 4A to 4G are plan views illustrating a method for fabricating a semiconductor device in accordance with an embodiment of the present invention and FIGS. 5A to 5G are cross-sectional views taken along the line I-I' illustrated in FIGS. 4A to 4G.

Figure 4A:
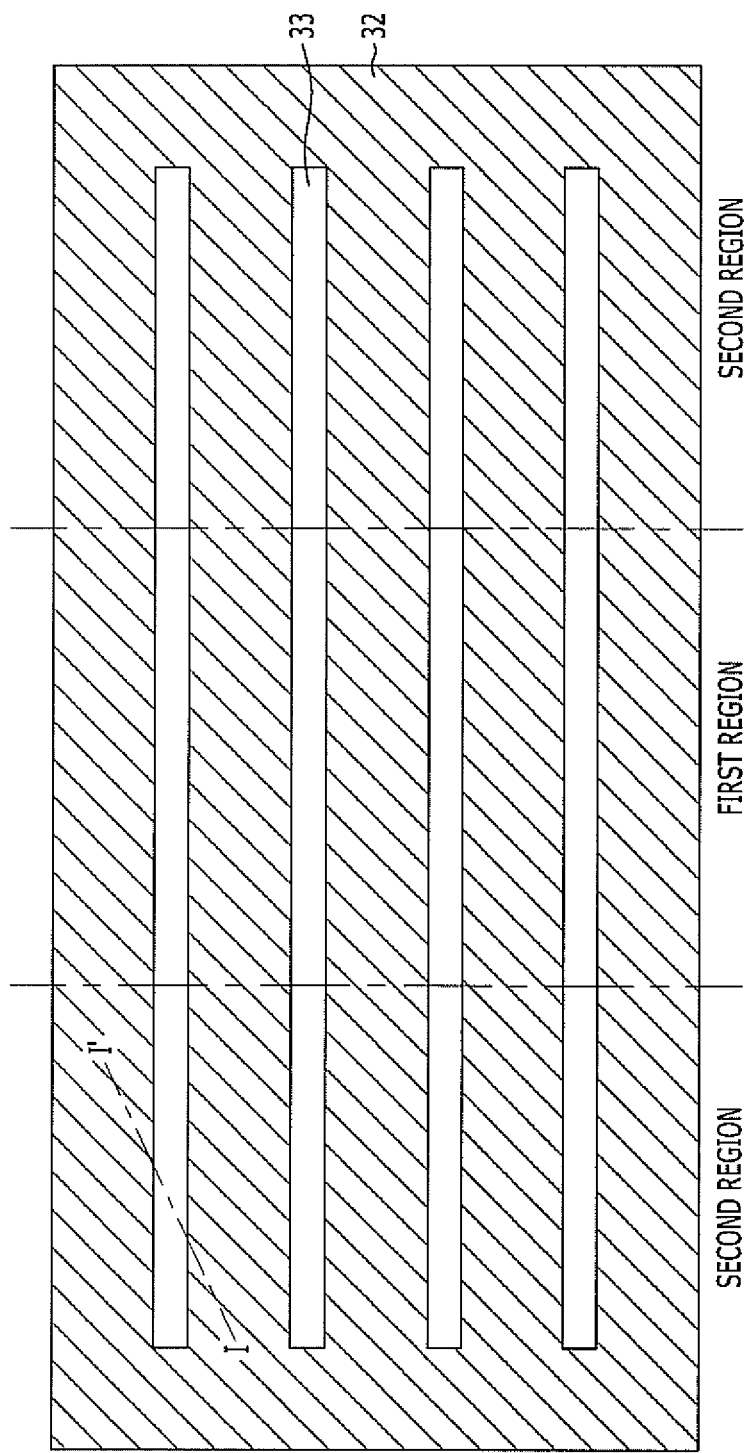
Figure 5A:
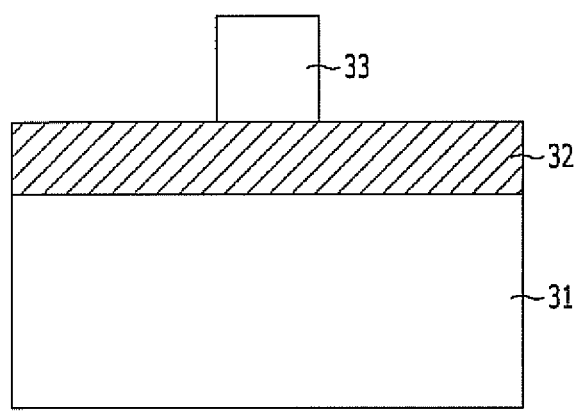
FIGS. 5A to 5G are cross-sectional views taken along the line I-I' illustrated in FIGS. 4A to 4G.

As illustrated in FIGS. 4A and 5A, a conductive layer 32 is formed on a substrate 31 having a first region and a second region. In the configuration of the embodiment, the first region may be a cell region and the second region may be a peripheral circuit region. In detail, the second region may be a decoder region and may be disposed at both sides of the first region.

Next, a sacrificial pattern 33 is formed on the conductive layer 32. The sacrificial pattern 33 may be formed in a line pattern that extends from the first region to the second region and is formed to have the same dimensions in both the first region and the second region.

Figure 4B:
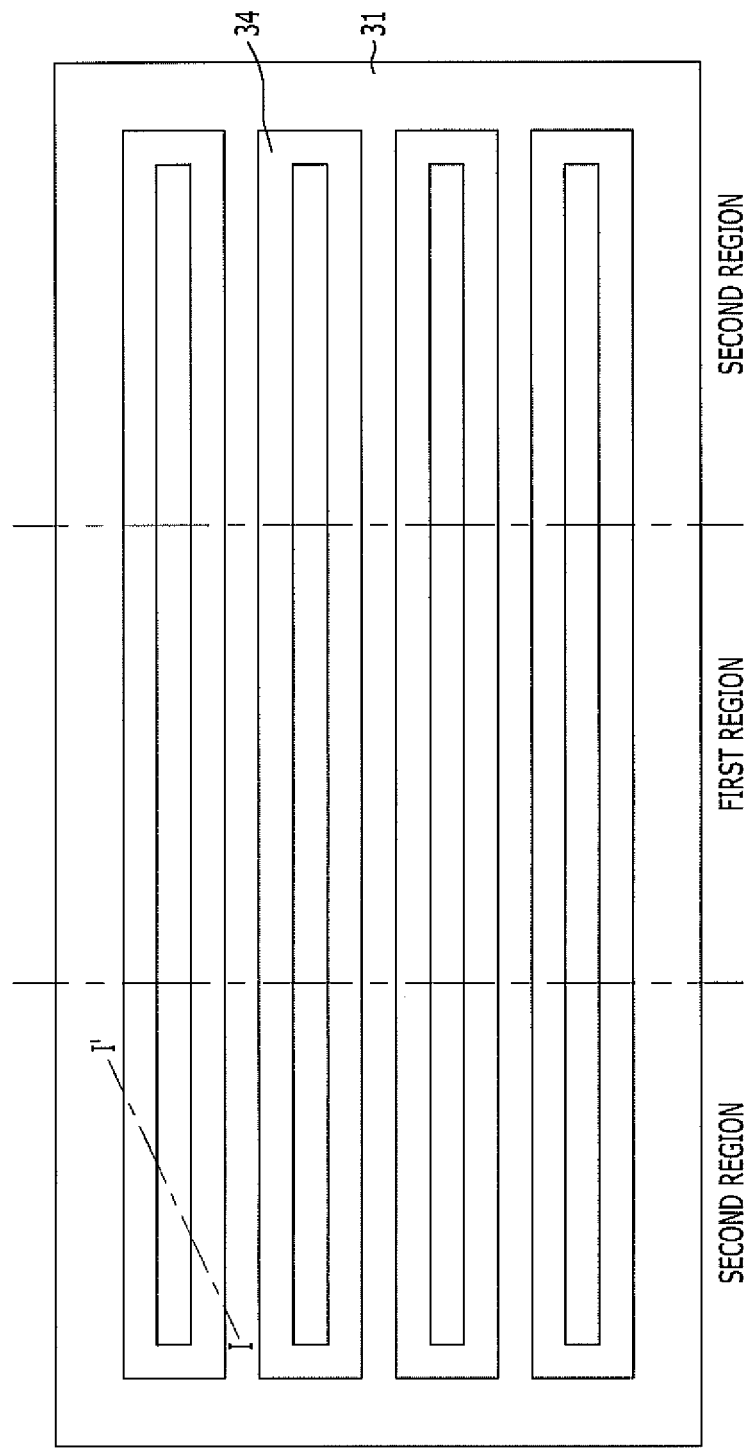
Figure 5B:
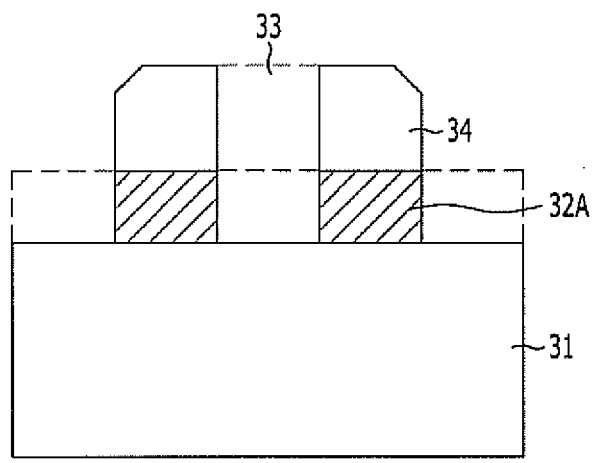

As illustrated in FIGS. 4B and 5B, a first mask pattern 34 is formed on one or more side walls of the sacrificial pattern 33. The first mask pattern 34 may have a spacer form and may be formed of a material having the same etching selectivity as the sacrificial pattern 33. The first mask pattern 34 formed on one or more of the side walls of the sacrificial pattern 33 is a line pattern having a ring shape and has the same critical dimensions (CD) both in the first region and the second region.

Next, after the sacrificial pattern 33 is removed, conductive lines 32A are formed by etching the conductive layer 32 using the first mask pattern 34 as an etch mask. After etching the conductive layer 32, the conductive lines 32A are formed and may be word lines.

Figure 4C:
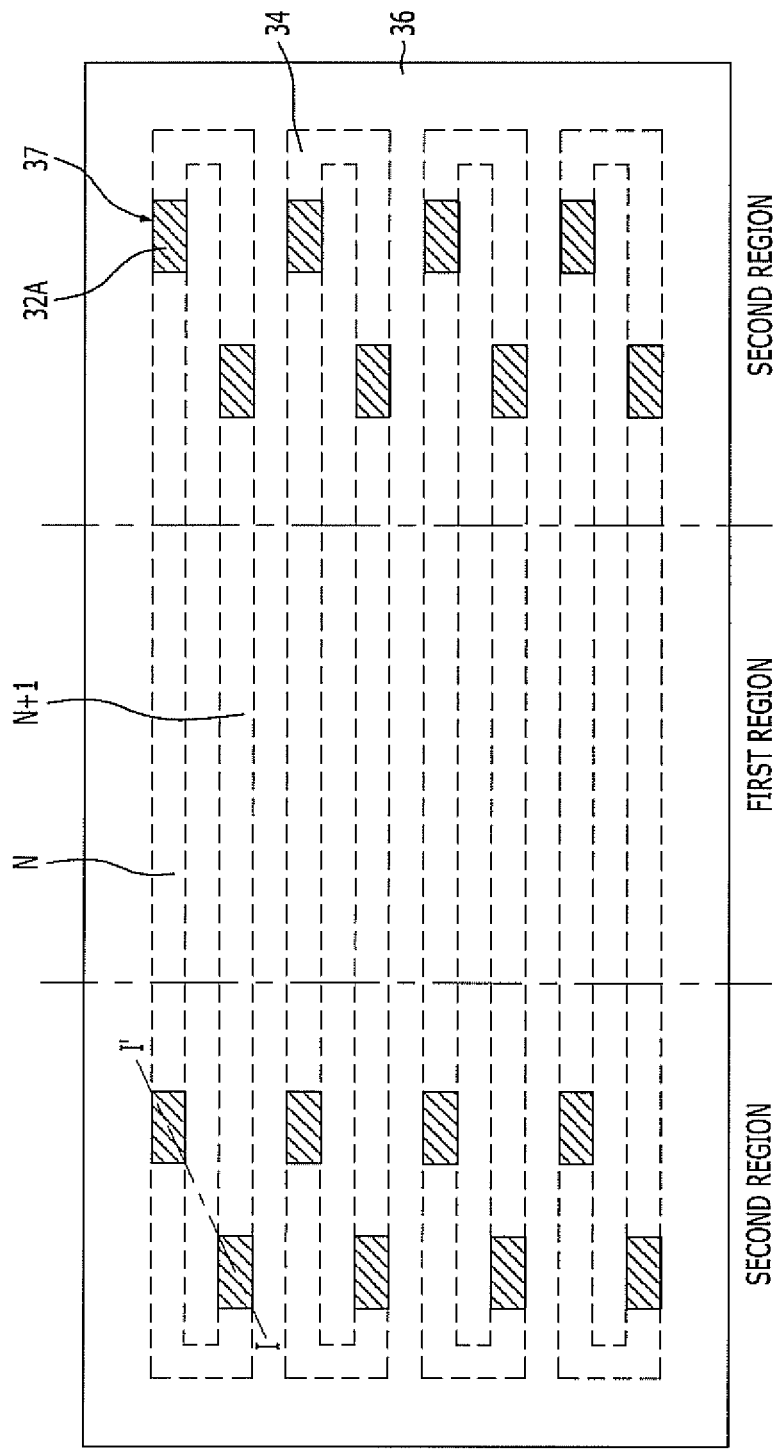
Figure 5C:
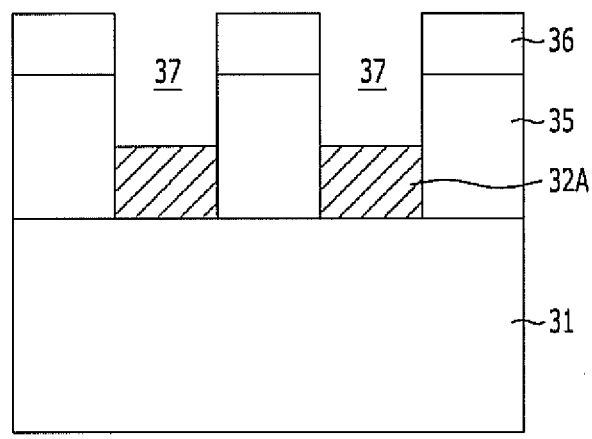

As illustrated in FIGS. 4C and 5C, after the first mask pattern 34 is removed, interlayer insulating layers 35 covering the conductive lines 32A are formed over the substrate 31. The interlayer insulating layers 35 may be formed of any one selected from a group consisting of an oxide layer, a nitride layer, and an oxynitride layer.

Next, a second mask pattern 36 is formed on the interlayer insulating layer 35 using a contact mask. The second mask pattern 36 may be formed by photoresist.

Next, the interlayer insulating layer 35 is etched using the second mask pattern 36 as the etch barrier to form open regions 37 that partially expose the surface of the conductive lines 32A in the second region. The open regions 37 are formed in a zigzag formation in which the open region 37 exposing an N-the conductive line 32A intersects with the open region 37 exposing an N+1-th conductive line 32A. As shown in FIG. 4C, a group of plural open regions 37 exposing odd numbered conductive lines 32A based on any one conductive line 32A is formed in the second region so as to be aligned in a line perpendicular with the extending direction of the conductive lines 32A, and a group of plural open regions 37 exposing even numbered conductive lines 32A is formed in the second region so as to be aligned in a line perpendicular with the extending direction of the conductive lines 32A. This formation is implemented to reduce process difficulty of subsequent processes (for example, a metal wiring forming process, or the like). Further, the open regions 37 formed in a second region of one side and the open regions 37 formed in the second region of the other side based on the first region are formed so as to be asymmetrical with each other.

Figure 4D:
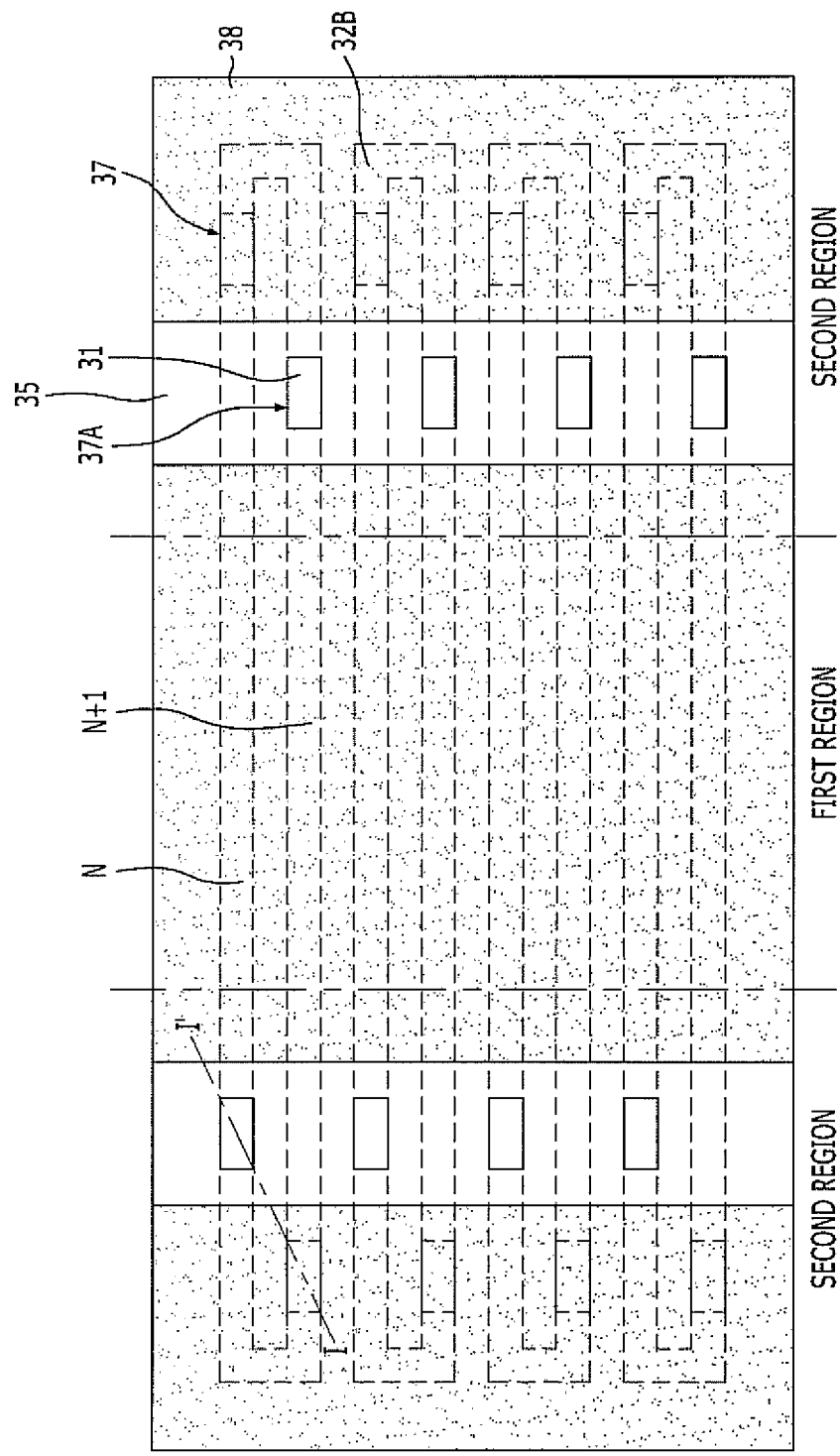
Figure 5D:
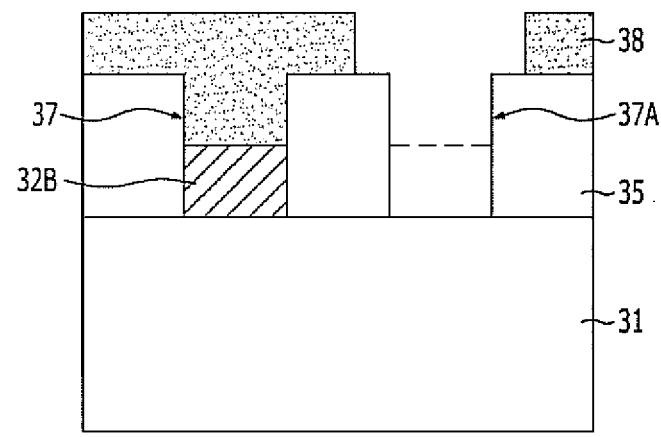

As illustrated in FIGS. 4D and 5D, after the second mask pattern 36 is removed, a third mask pattern 38 is formed using a cut mask. The third mask pattern 38 is made of a material having the same etch selectivity as the interlayer insulating layer 35. For example, when the interlayer insulating layer 35 is formed of the oxide layer, the third mask pattern 38 may be formed of the nitride layer.

The third mask pattern 38 may cover some of the open regions 37 and expose some of the open regions 37. For example, the open regions 37 that are formed in the odd numbered or even numbered conductive lines 23A based on any one conductive line 32A may be exposed. Since the open region 37 formed in the odd numbered (or even numbered) conductive lines based on any one conductive line 32A are aligned in a line, an open part of the third mask pattern 38 may be formed in a line type. More specifically, the form of the cut mask may be simplified and the difficulty of the process of forming the third mask pattern 38 may be reduced.

When the open part of the third mask pattern 38 formed in the second region of one side based on the first region exposes the open regions 37 formed in the odd numbered conductive lines 32A based on any one conductive line 32A, the open part of the third mask pattern 38 formed in the second region of the other side of the first region is formed to expose the open regions 37 formed in the even numbered conductive lines 32A, or vice versa. This is for all of the plurality of separated conductive lines 32B to have the same length through the subsequent processes.

Next, the conductive lines 32A exposed by the third mask pattern 38 and the open regions 37 are etched until the substrate 31 is exposed. By etching the exposed conductive lines 32A, adjacent conductive lines are separated from each other. For illustration purposes, the separated conductive lines are denoted by reference numeral '32B', and the open regions that have been extended after the etching of the conductive lines 32A is denoted by reference numeral '37A'.

Figure 5E:
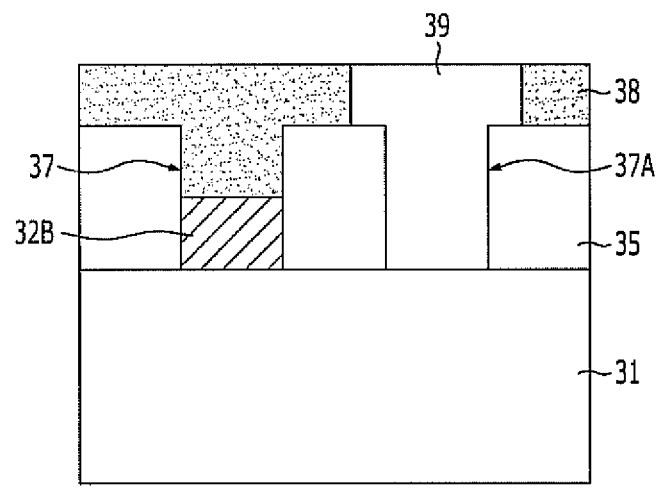

As illustrated in FIGS. 4E and 5E, insulating layers 39 are deposited over the substrate 31 to gap-fill the expanded open region 37A and subsequently, a planarization process is performed until the third mask pattern 38 is exposed. The planarization process may be performed using chemical mechanical polishing (CMP). The insulating layer 39 may be made of the same material as the interlayer insulating layer 35.

Figure 4F:
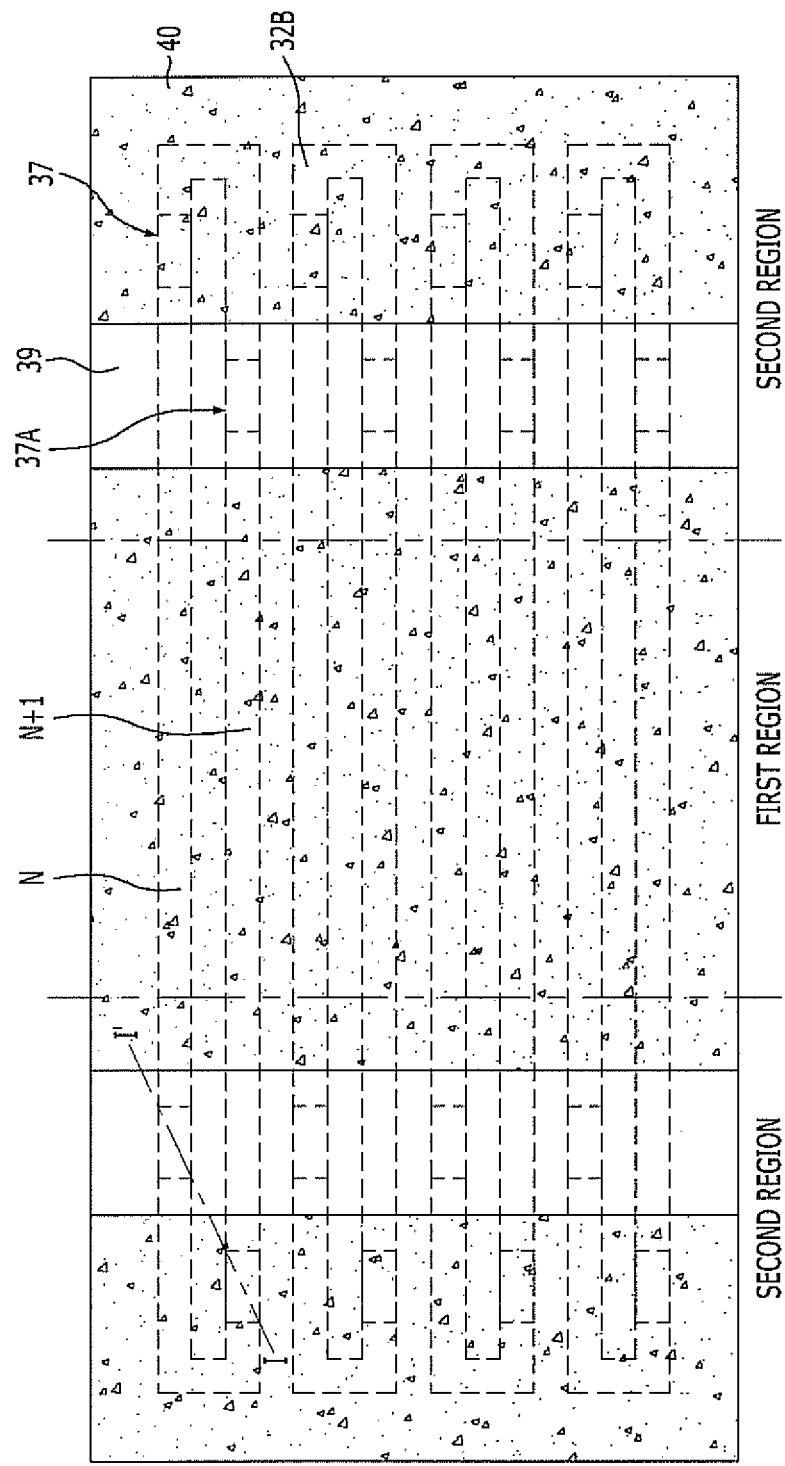
Figure 5F:
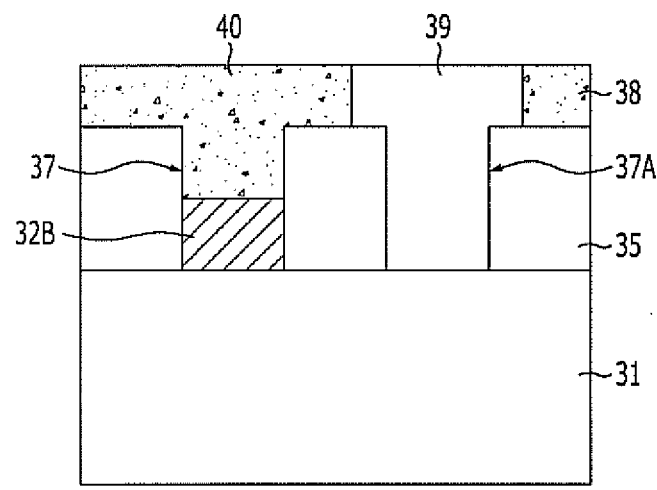

As illustrated in FIGS. 4F and 5F, the third mask pattern 38 is removed.

Next, a conductive layer 40 is formed over the substrate 31 so as to gap-fill the open regions 37 after the removal of the third mask pattern 38. The conductive layer 40 may be used to form a plug.

Figure 4G:
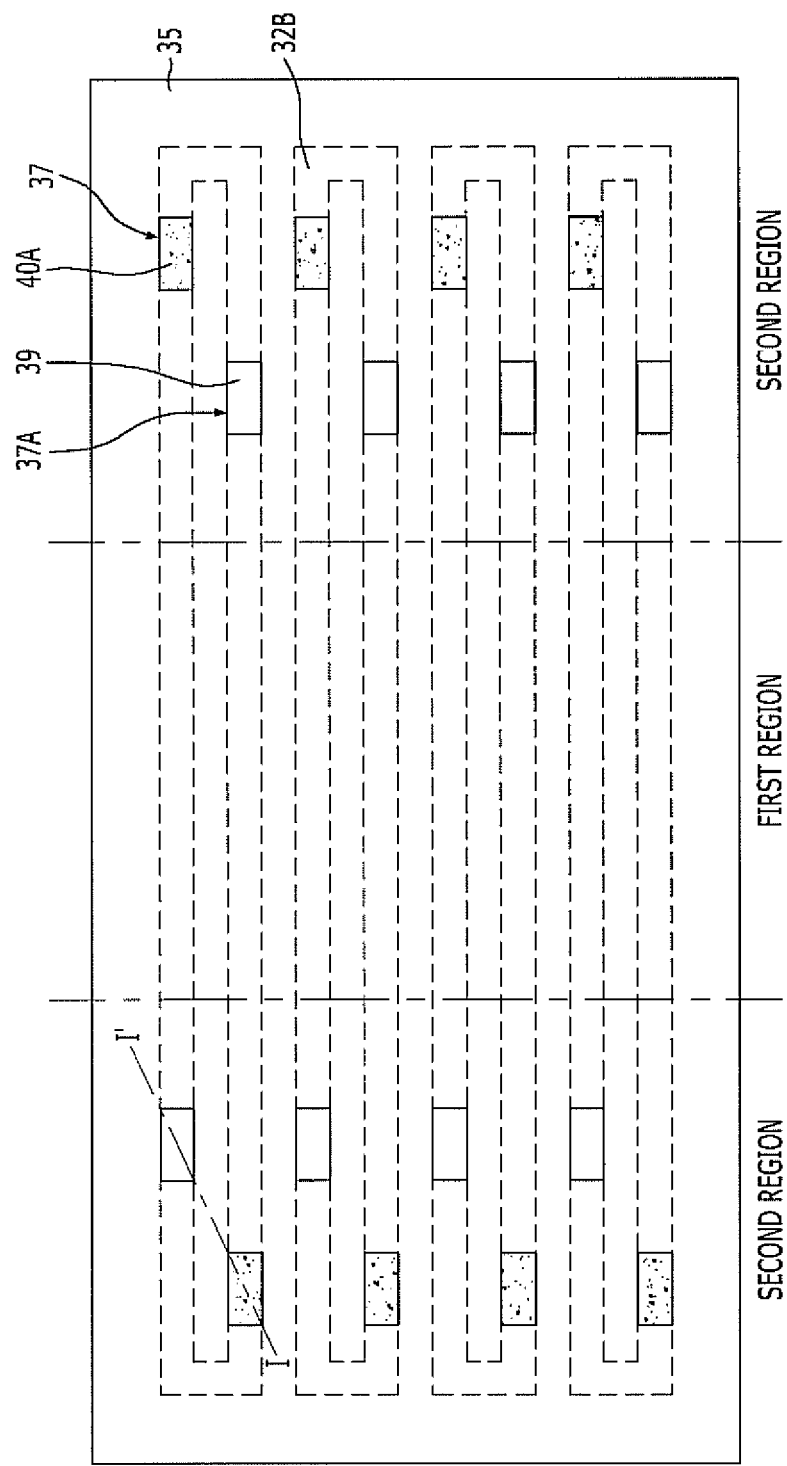
Figure 5G:
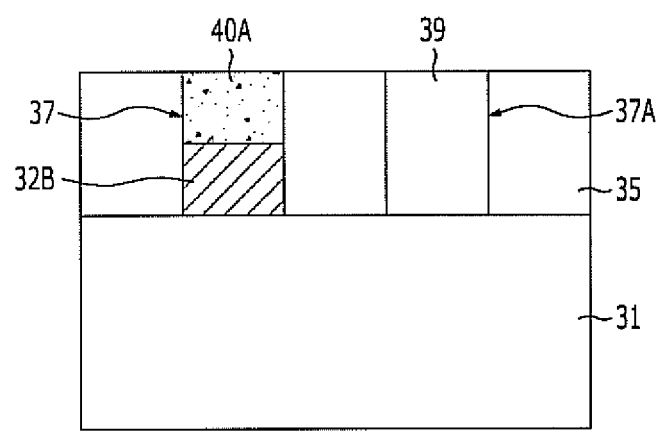

As illustrated in FIGS. 4G and 5G, a planarization process is performed until the interlayer insulating layer 35 is exposed to form contact plugs 40A buried in the open regions 37. The conductive lines 32B formed under the contact plugs 40A are implemented as the pads. The planarization process may be performed using the chemical mechanical polishing.

Although not illustrated, metal wiring contacting the contact plugs 40A may be subsequently formed on the interlayer insulating layer 35.

The semiconductor device in accordance with the exemplary embodiments of the present invention formed through the above-mentioned processes has the padless structure. In addition, the exemplary embodiments of the present invention can increase the integration of the second region (more specifically, the peripheral circuit region). More specifically, the exemplary embodiments of the present invention can reduce the area of the second region to reduce the chip size. Further, the exemplary embodiments of the present invention can simplify the process of fabricating the semiconductor device and reduce the process difficulty, thereby improving the manufacturing yield of the semiconductor device.

As set forth above, the exemplary embodiments of the present invention have the padless structure, thereby basically preventing the problems caused in forming the pads in accordance with the related art.

In addition, the exemplary embodiments of the present invention can increase the integration of the second region according to the integration of the first region to remarkably reduce the area of the second region, thereby easily reducing the chip size.

Further, the exemplary embodiments of the present invention can simplify the process of fabricating the semiconductor device and reduce process difficulty, thereby improving the manufacturing yield of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first group of conductive lines extending from a first region to a plurality of second regions over a substrate having the first region and the plurality of second regions;
    forming a second group of conductive lines that alternate with the first group of lines and extend from the first region to the plurality of second regions over the substrate;
    forming interlayer insulating layers over the substrate;
    forming open regions partially exposing the first and second groups of conductive lines by selectively etching the interlayer insulating layers in the plurality of second regions;
    forming an extended open region by removing a portion of each conductive line in the first group of conductive lines exposed by the open regions;
    forming insulating layers in the extended open regions; and
    forming contact plugs by gap-filling the open regions.

2. The method of claim 1, wherein the forming of the first and second group of conductive lines includes:
    forming a conductive layer on the substrate;
    forming a sacrificial pattern in a line shape extending from the first region to the plurality of second regions on the conductive layer;
    forming a mask pattern on a side wall of the sacrificial pattern;
    removing the sacrificial pattern; and
    etching the conductive layer using the mask pattern as an etch mask.

3. The method of claim 1, wherein each conductive line in the first group of conductive lines is connected to one conductive line in the second group of conductive lines and both ends of the conductive lines prior to forming the extended open region, and
    the first group of conductive line is electrically separated from the second group of conductive line after forming of the extended open region.

4. The method of claim 1, wherein the forming of the open regions forms the open regions in a zigzag form.

5. The method of claim 1, wherein at the forming of the open regions, the first group of the open regions is aligned in a first line perpendicular with the extending direction of the conductive lines and the second group of the open regions is aligned in a second line perpendicular with the extending direction of the conductive lines.

6. The method of claim 1, wherein the plurality of second regions are disposed at both sides of the first region.

7. The method of claim 6, wherein at the forming of the open regions, the open regions formed in the second regions of one side based on the first region and the open regions formed in the second regions of the other side are formed so as to be asymmetrical with each other.

8. The method of claim 1, wherein the first region includes a cell region and the second region includes a peripheral circuit region.

9. A method for fabricating a semiconductor device, comprising:
    forming a first group of conductive lines extending from a first region to a pair of second regions on a substrate having the first region and second regions disposed at both sides of the first region;
    forming a second group of conductive lines that alternate with the first group of lines and extend from the first region to the second regions over the substrate at both sides of the first region;
    forming interlayer insulating layers over the substrate;
    forming open regions partially exposing the first and second group of conductive lines by selectively etching the interlayer insulating layers of the second regions;
    forming a mask pattern exposing the open regions formed in the first group of conductive lines on the interlayer insulating layers;
    forming extended open regions by etching the first group of conductive lines in the open regions exposed by the mask pattern;
    forming insulating layers burying the extended open regions;
    removing the mask pattern;
    forming a conductive layer for a plug in the open regions over the substrate; and
    forming contact plugs in the open regions by performing a planarization process until the interlayer insulating layers are exposed.

10. The method of claim 9, wherein the forming of the first and second group of conductive lines includes:
    forming a conductive layer on the substrate;
    forming a sacrificial pattern in a line shape extending from the first region to the second regions on the conductive layer;
    forming a mask pattern on a side wall of the sacrificial pattern;
    removing the sacrificial pattern; and
    etching the conductive layer using the mask pattern as an etch mask.

11. The method of claim 9, wherein each conductive line in the first group of conductive lines is connected to one conductive line in the second group of the conductive lines at both ends of the conductive lines prior to forming the extended open region, and
    the first group of conductive line is electrically separated from the second group of conductive line after forming of the extended open region.

12. The method of claim 9, wherein the forming of the open regions forms the open regions in a zigzag.

13. The method of claim 9, wherein at the forming of the open regions, the first group of the open regions is aligned in a first line perpendicular with the extending direction of the conductive lines and a the second group of the open regions is aligned in a second line perpendicular with the extending direction of the conductive lines.

14. The method of claim 9, wherein at the forming of the open regions, the open regions formed in the second regions of one side based on the first region and the open regions formed in the second regions of the other side are formed so as to be asymmetrical with each other.

15. The method of claim 9, wherein the mask pattern and the interlayer insulating layer are made of materials having different etch selectivities.

16. The method of claim 9, wherein the insulating layer and the interlayer insulating layer are made of the same material.

17. The method of claim 9, wherein the first region includes a cell region and the second region includes a peripheral circuit region.

* * * * *